(12) United States Patent
Bryant et al.

(10) Patent No.: US 7,511,344 B2
(45) Date of Patent: Mar. 31, 2009

(54) FIELD EFFECT TRANSISTOR

(75) Inventors: Andres Bryant, Burlington, VT (US); Jia Chen, Ossining, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/623,963

(22) Filed: Jan. 17, 2007

(65) Prior Publication Data

US 2008/0169472 A1 Jul. 17, 2008

(51) Int. Cl.
*H01L 23/62* (2006.01)
(52) U.S. Cl. .................. 257/347; 257/E51.04; 977/762
(58) Field of Classification Search .................. 257/40, 257/401; 438/486; 977/742
See application file for complete search history.

(56) References Cited

U.S. PATENT DOCUMENTS

| | | | |
|---|---|---|---|
| 6,262,468 B1 | 7/2001 | Imam et al. | |
| 6,838,735 B1 * | 1/2005 | Kinzer et al. | ................ 257/365 |
| 6,972,467 B2 | 12/2005 | Zhang et al. | |
| 2003/0098488 A1 * | 5/2003 | O'Keeffe et al. | ............ 257/401 |
| 2005/0056826 A1 | 3/2005 | Appenzeller et al. | |
| 2005/0253134 A1 * | 11/2005 | Kasama et al. | ................ 257/40 |
| 2006/0052947 A1 | 3/2006 | Hu | |

* cited by examiner

*Primary Examiner*—N Drew Richards
*Assistant Examiner*—Mamadou Diallo
(74) *Attorney, Agent, or Firm*—Gibb I.P. Law Firm, LLC; Richard Kotulak, Esq.

(57) ABSTRACT

Disclosed are embodiments of a field effect transistor that incorporates an elongated semiconductor body with a spiral-shaped center channel region wrapped one or more times around a gate and with ends that extend outward from the center region in opposite directions away from the gate. Source/drain regions are formed in the end regions by either doping the end regions or by biasing a back gate to impart a preselected Fermi potential on the end regions. This disclosed structure allows the transistor size to be scaled without decreasing the effective channel length to the point where deleterious short-channel effects are exhibited. It further allows the transistor size to be scaled while also allowing the effective channel length to be selectively increased (e.g., by increasing the number of times the channel wraps around the gate). Also, disclosed are embodiments of an associated method of forming the transistor.

21 Claims, 19 Drawing Sheets

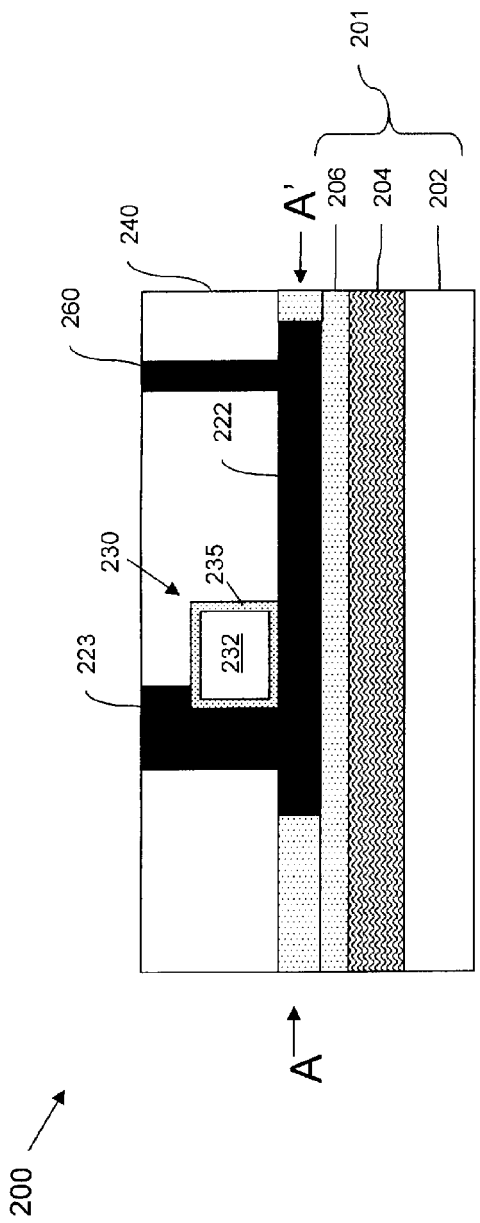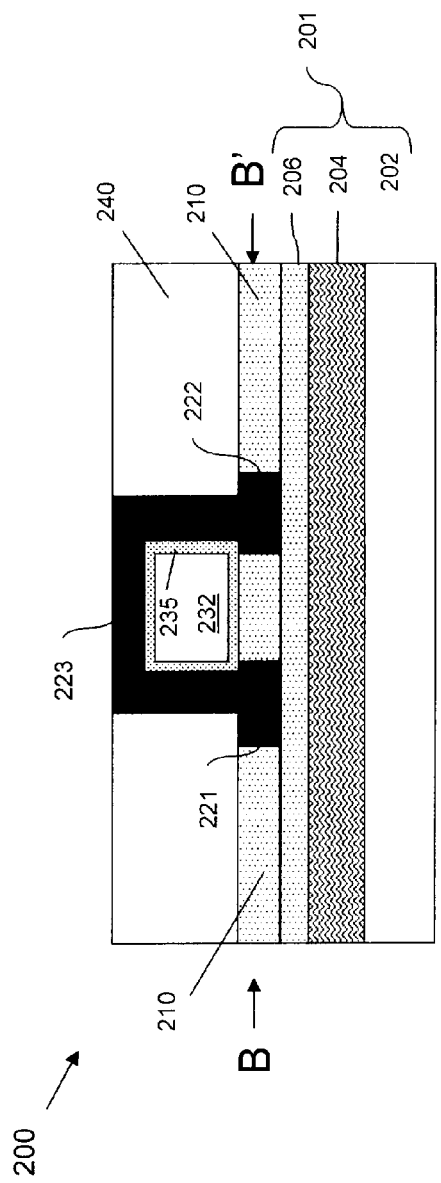
Figure 3
Figure 4

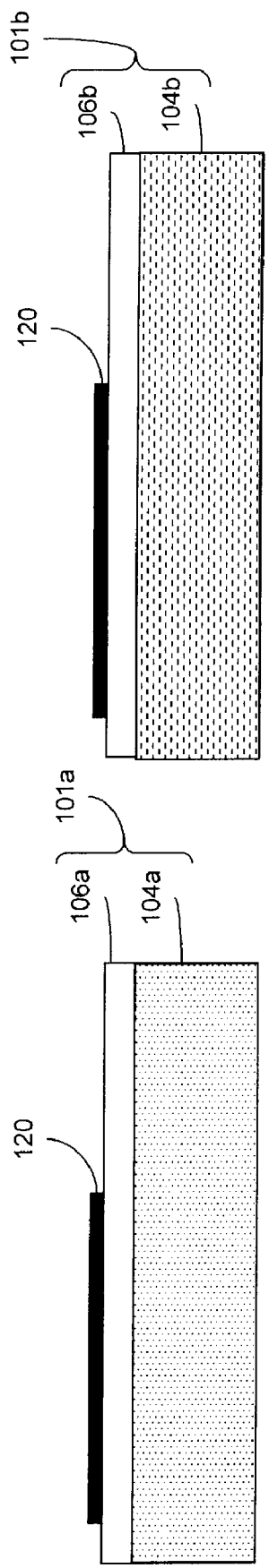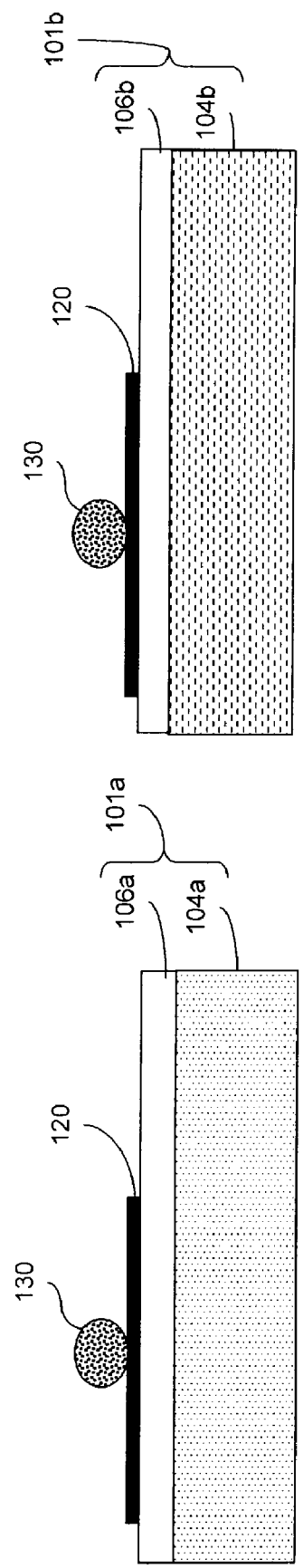
Figure 9b
Figure 10b
Figure 9a
Figure 10a

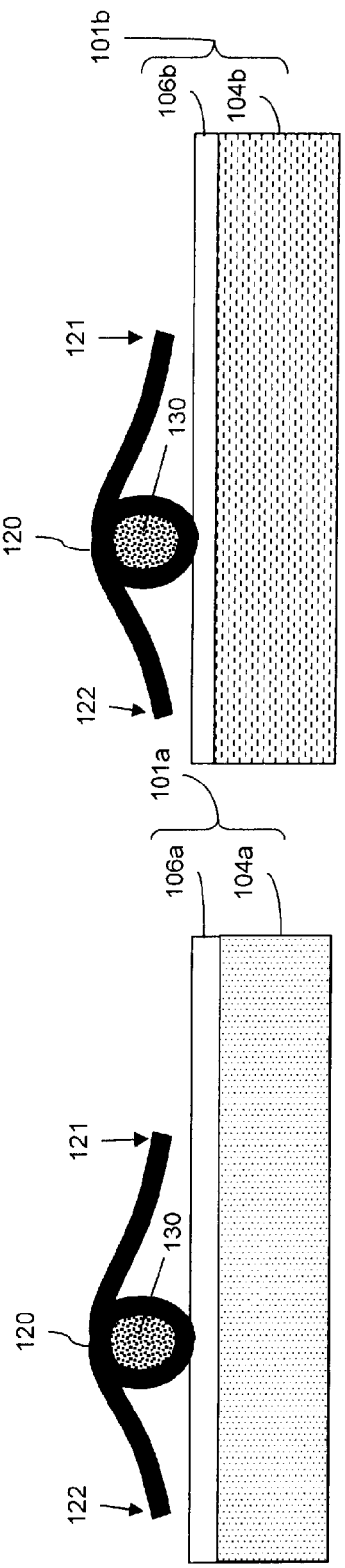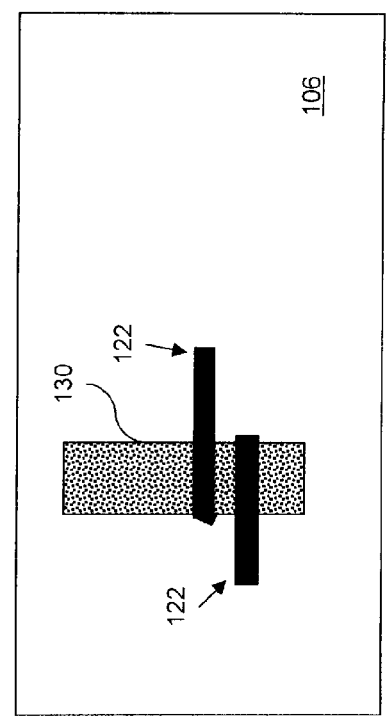

FIELD EFFECT TRANSISTOR

BACKGROUND

1. Field of the Invention

The embodiments of the invention generally relate to field effect transistors and, more particularly, to a field effect transistor having an increased effective channel length ($L_{eff}$).

2. Description of the Related Art

Over the past few decades numerous performance and economic advantages have been seen with semiconductor technology scaling. For example, transistor size scaling has lead to decreased channel lengths and a corresponding increase in switching speeds (i.e., shorter channel lengths correspond to faster switching speeds). However, recently it has been determined that such scaling has its limits because short channel lengths can lead to undesirable "short-channel effects" including, but not limited, variability in threshold voltage and excessive drain leakage currents. Therefore, there is a need in the art for an improved transistor that allows for transistor size scaling without decreasing the effective channel length to the point where such short-channel effects are exhibited.

SUMMARY

In view of the foregoing, disclosed above are embodiments of a field effect transistor (FET) that incorporates a semiconductor body with a spiral-shaped center channel region wrapped one or more times around a gate and with end regions that extend outward from the center region in opposite directions away from the gate. Source/drain regions are formed in the end regions by either doping the end regions or by biasing a back gate to impart a preselected Fermi potential on the end regions. This disclosed structure allows the transistor size to be scaled without decreasing the effective channel length ($L_{eff}$) to the point where deleterious short-channel effects are exhibited. It further allows the transistor size to be scaled while also allowing the effective channel length ($L_{eff}$) to be selectively increased (e.g., by increasing the number of times the channel wraps around the gate). Also, disclosed are embodiments of an associated method of forming the transistor.

More particularly, embodiments of the transistor comprise an isolation layer (e.g., an oxide layer or other dielectric layer) on either a conductor layer (e.g., a doped semiconductor layer, such as a doped silicon or polysilicon layer, or a metal layer) or a semiconductor layer. A gate and a semiconductor body are positioned above the isolation layer.

The gate is an elongated structure (e.g., a cylindrical or rectangular body). It extends across the isolation layer in a first direction and comprises a gate conductor (e.g., a doped semiconductor, such as a doped polysilicon or a metal) surrounded on all sides by a gate dielectric layer.

The semiconductor body is also elongated and can comprise, for example, polysilicon, silicon, an organic molecular material, or a carbon nanotube, or a semiconducting nanowire (e.g., III-V or II-VI). The semiconductor body further extends across the isolation layer in a second direction (e.g., in a direction approximately opposite the direction of the gate). The semiconductor body comprises a center region and end regions.

The center region of the semiconductor body forms the channel region of the transistor, is spiral-shaped and wraps around the gate one or more times. Thus, the effective channel length ($L_{eff}$) depends upon the number of times the center region wraps round the gate. That is, the greater the number of times the it wraps around the gate, the greater the effective channel length ($L_{eff}$).

The end regions of the semiconductor body extend outward from the center region away from the gate and in opposite directions. Furthermore, the end regions are positioned immediately adjacent to the isolation layer. The end regions of the semiconductor body can be appropriately doped with a p-type dopant or n-type dopant so as to create the source/drain regions of a p-type FET or n-type FET, respectively. Alternatively, the end regions of the semiconductor body can remain undoped and the source/drain regions can be created by biasing the conductor layer below the isolation layer in order to impart a preselected Fermi potential to the end regions and, thereby, configure the transistor as either a p-type FET or an n-type FET.

Also disclosed are embodiments of a method of forming the transistor described above. The embodiments of the method comprise providing a wafer comprising a thin isolation layer on either a conductor layer or a semiconductor layer. Then, a field effect transistor, including a gate and a semiconductor body, is formed on the wafer above the isolation layer.

To form the gate, an elongated gate conductor (e.g., a cylindrical or rectangular conductor body) is formed that extends across the isolation layer in a first direction and is surrounded on all sides by a gate dielectric layer.

To form the semiconductor body, an elongated semiconductor structure (e.g., a polysilicon body, a silicon body, a carbon nanotube body, a body comprising an organic molecular material, or a body comprising another suitable semiconductor material (such as uniform or compound nanowires) is formed that extends across the isolation layer in a second direction (e.g., opposite the first direction).

More specifically, the semiconductor body is formed so that it has a spiral-shaped center region that wraps around the gate one or more times and comprises the channel region of the transistor. The semiconductor body is further formed so that it has end regions that extend outward away from the gate and, specifically, away from the ends of the spiral-shaped center region in opposite directions and adjacent to the isolation layer.

The embodiments of the method can also comprise selectively adjusting the effective channel length ($L_{eff}$) of the channel region by varying the number of times the spiral is wrapped around the gate during the semiconductor body formation process. The more times it wraps around the gate, the greater the effective channel length ($L_{eff}$).

The embodiments of the method can further comprise creating the source/drain regions in the end regions by appropriately doping the end regions of the semiconductor body with a p-type dopant or an n-type dopant so as to configure the transistor as either a p-type or n-type transistor, respectively.

Alternatively, the embodiments of the method can comprise leaving the end regions undoped and biasing either a conductor layer below the isolation layer or a conductive pad above the portion of the gate wrapped with the semiconductor in order to impart a preselected Fermi potential to the end regions in order to create "virtual" source/drain regions and, thereby, to configure the transistor as either a p-type or n-type transistor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 3 is a schematic diagram illustrating a cross-section (A-A') view of the transistor embodiment 200;

FIG. 4 is a schematic diagram illustrating a different cross-section (B-B') view of the transistor embodiment 200;

FIG. 9a is a schematic diagram illustrating a partially completed transistor 100 formed on a substrate 101a according to the method embodiment of FIG. 8;

FIG. 9b is a schematic diagram illustrating a partially completed transistor 100 formed on a substrate 101b according to the method embodiment of FIG. 8;

FIG. 10a is a schematic diagram illustrating a partially completed transistor 100 formed on a substrate 101a according to the method embodiment of FIG. 8;

FIG. 10b is a schematic diagram illustrating a partially completed transistor 100 formed on a substrate 101b according to the method embodiment of FIG. 8;

FIG. 13a is a schematic diagram illustrating a partially completed transistor 100 formed on a substrate 101a according to the method embodiment of FIG. 8;

FIG. 13b is a schematic diagram illustrating a partially completed transistor 100 formed on a substrate 101b according to the method embodiment of FIG. 8;

FIG. 14 is a top view of the partially completed structures of both FIGS. 13a and 13b;

DETAILED DESCRIPTION OF PREFERRED EMBODIMENTS

Figure 1:
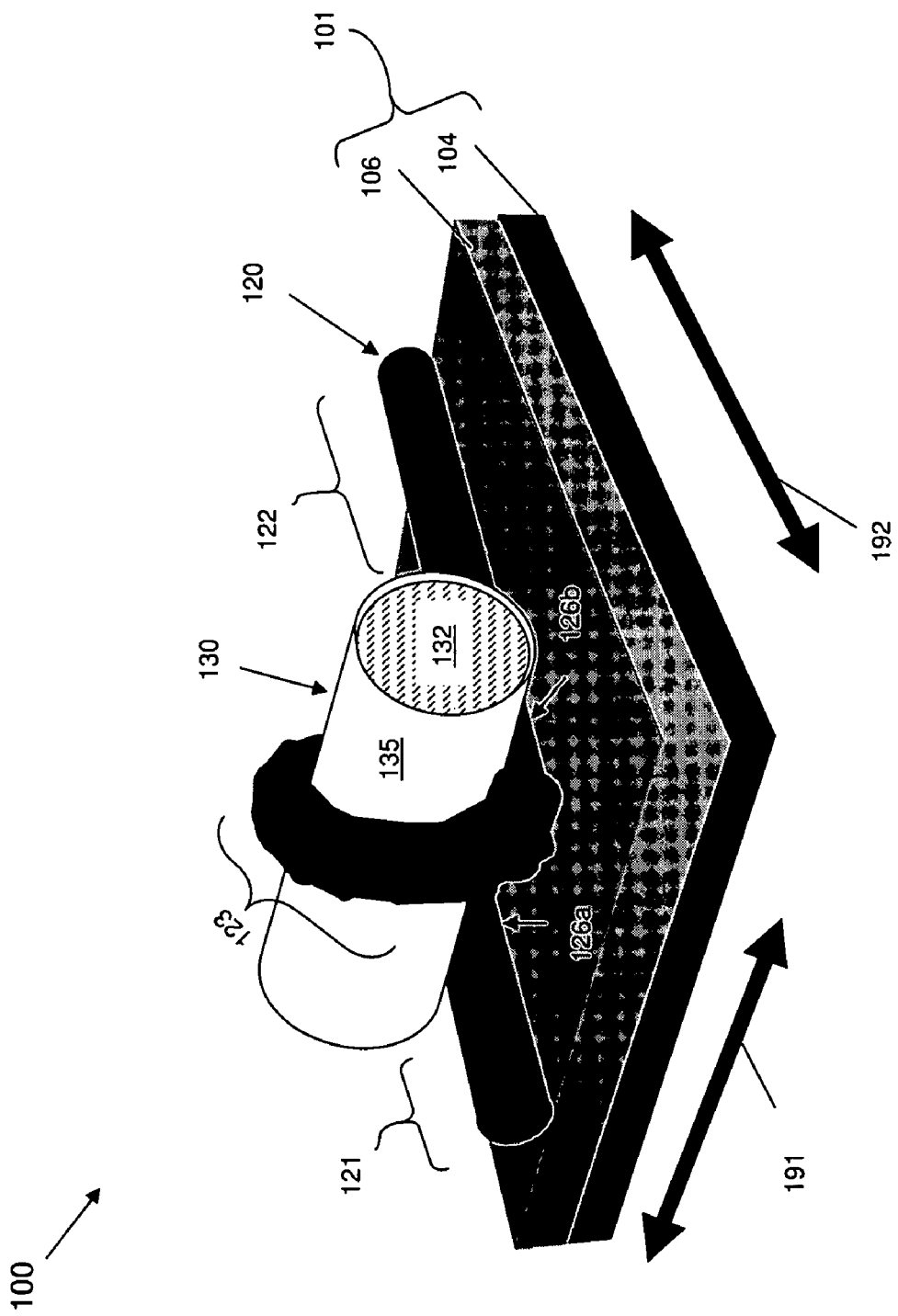
FIG. 1 is a schematic diagram illustrating a perspective view of a transistor embodiment 100.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, recently it has been determined that device scaling has its limits because short channel lengths can lead to undesirable "short-channel effects" including, but not limited, variability in threshold voltage and excessive drain leakage currents. Therefore, there is a need in the art for an improved transistor that allows for transistor size scaling without decreasing the effective channel length to the point where such short-channel effects are exhibited. Therefore, disclosed herein are embodiments of a field effect transistor (FET) that incorporates a semiconductor body with a spiral-shaped center channel region wrapped one or more times around a gate and with end regions that extend outward from the center region in opposite directions away from the gate. Source/drain regions are formed in the end regions by either doping the end regions or by biasing a back gate to impart a preselected Fermi potential on the end regions. This disclosed structure allows the transistor size to be scaled without decreasing the effective channel length ($L_{eff}$) to the point where deleterious short-channel effects are exhibited. It further allows the transistor size to be scaled while also allowing the effective channel length ($L_{eff}$) to be selectively increased (e.g., by increasing the number of times the channel wraps around the gate). Also, disclosed is an associated method of forming the transistor.

Figure 2:
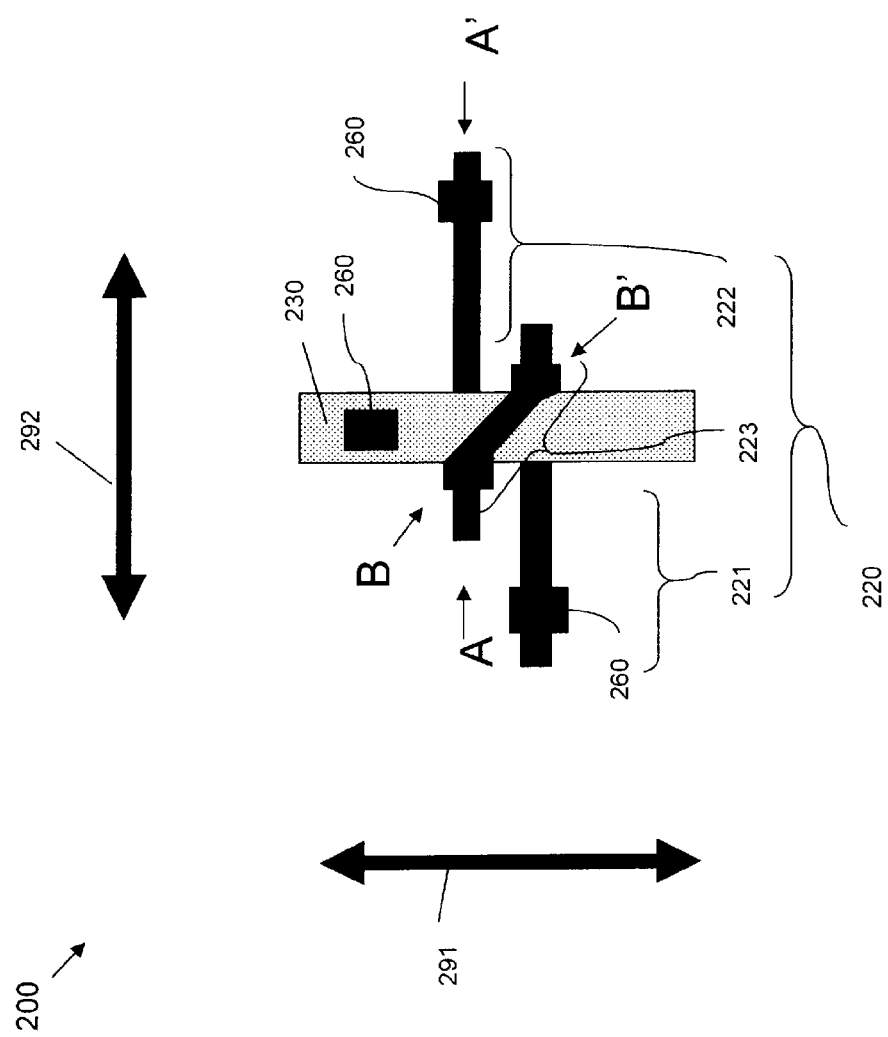
FIG. 2 is a schematic diagram illustrating a top view of another transistor embodiment 200.

More particularly, FIG. 1 is perspective view diagram illustrating a field effect transistor (FET) embodiment 200 of the invention and FIGS. 2-4 are top and cross-section views of the transistor embodiment 200 of the invention. As illustrated, each of these transistor embodiments 100 and 100 comprise a substrate 101, 201. The substrate 101, 201 can comprise multiple layers. For example, the substrate 101, 201 can comprise an isolation layer 106, 206 (e.g., an oxide layer or other dielectric layer) on at least one additional layer 104, 204. This additional layer 104, 204 can comprise a conductor layer (e.g., a doped semiconductor layer, such as a doped silicon or polysilicon layer, or a metal layer) immediately below the isolation layer. Alternatively, this additional layer 104, 204 can comprise semiconductor layer (e.g., on a silicon layer) below the isolation layer 106.

A gate 130, 230 and a semiconductor body 120, 220 are positioned above the substrate 101, 201.

The gate 130, 230 is an elongated structure (e.g., a cylindrical body, as illustrated in transistor embodiment 100 of FIG. 1 or a rectangular body, as illustrated in transistor embodiment 200 of FIGS. 2-4). This gate 130, 230 extends across the isolation layer 106, 206 in a first direction 191, 291 and comprises a gate conductor (e.g., a doped semiconductor, such as a doped polysilicon, or a metal) that is surrounded on all sides by a gate dielectric layer 135, 235.

The semiconductor body 120, 220 is also elongated and can comprise any suitable semiconductor material or any material capable of exhibiting semiconductive properties. For example, the semiconductor body 120, 220 can comprise polysilicon, silicon, an organic molecular material, or a carbon nanotube, or a semiconducting nanowire (group IV, or III-V or II-VI compound). The semiconductor body 120, 220 further extends across the isolation layer 106, 206 in a second direction 192, 292 (e.g., in a direction approximately opposite the direction of the gate 130, 230). The semiconductor body 120, 220 comprises a center region 123, 223 and end regions 121-122, 221-222.

The center region 123, 223 of the semiconductor body 120, 220 forms the channel region of the transistor and is spiral-shaped, wrapping around the gate 130, 230 one or more times. That is, the central channel region 123, 223 circles the gate 130, 230 such that it is offset along a linear distance of the gate 130, 230 each time it completes a spiral (i.e., each time it encircles the gate). In other words, the semiconductor body 120, 220 is elongated and has a center region 123, 223 that spirals around a gate structure 130, 230. Thus, the effective channel length ($L_{eff}$) depends upon the number of times the center region 123, 223 wraps around the gate 130, 230. That is, the greater the number of times, it wraps around the gate 130, 230, the greater the effective channel length ($L_{eff}$).

The end regions 121-122, 221-222 of the semiconductor body 120, 220 extend outward from each end 126a and 126b, 226a and 226b of the center region 123, 223 away from the gate 130, 230 and in opposite directions. Furthermore, the end regions 121-122, 221-222 can be positioned immediately adjacent to the isolation layer 106.

The end regions 121-122, 221, 222 of the semiconductor body 120, 220 can be appropriately doped with a p-type dopant (e.g., boron (B)) or an n-type dopant (e.g., phosphorous (P), arsenic (As) or antimony (Sb),) so as to create source/drain regions and thereby, to configure the FET as either a p-type FET or an n-type FET, respectively. However, the ability to adequately dope the end regions 121-122, 221, 222 of the semiconductor body can depend on the materials and/or the process steps used to form the transistor 100, 200. For example, those skilled in the art will recognize that carbon nanotubes are not easily doped. Carbon nanotubes can be doped by charge-transfer mechanism, e.g., by molecules through surface doping. P-doping can be realized by doping with one-electron oxidants, and n-doping can be realized by NH2-containing molecules. (prior arts of Jia Chen et al)

Therefore, alternate structures without doped source/drain regions are anticipated. For example, if the additional layer 104, 204 below the isolation layer 106, 206 in either structure 100 of FIG. 1 or structure 200 of FIG. 2 comprises a conductor, then the end regions 121-122, 212-222 can remain undoped and the conductor layer 104, 204 can function as a back gate. That is, the conductor layer can be biased. Biasing the conductor layer 104, 204 below the gate 130, 230 forms what are generally referred to in the art as "virtual" source/drain regions. Specifically, by for forcing the Fermi level of the opposing ends 121-122, 2221-222 of the semiconductor body 120, 220 (e.g., of a CNT) to either the valence or the conduction bands, the transistor 100 of FIG. 1 or 200 of FIG. 2 can be configured as either a p-type FET or an n-type FET, respectively.

Figure 5:
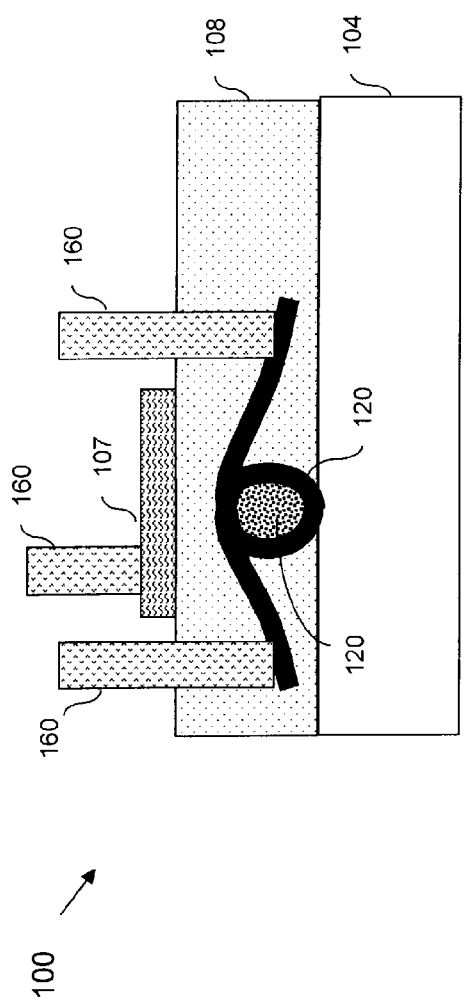
FIG. 5 is a schematic diagram illustrating a cross-section view of transistor embodiment 100, including a conductive pad formed above the transistor.
Figure 6:
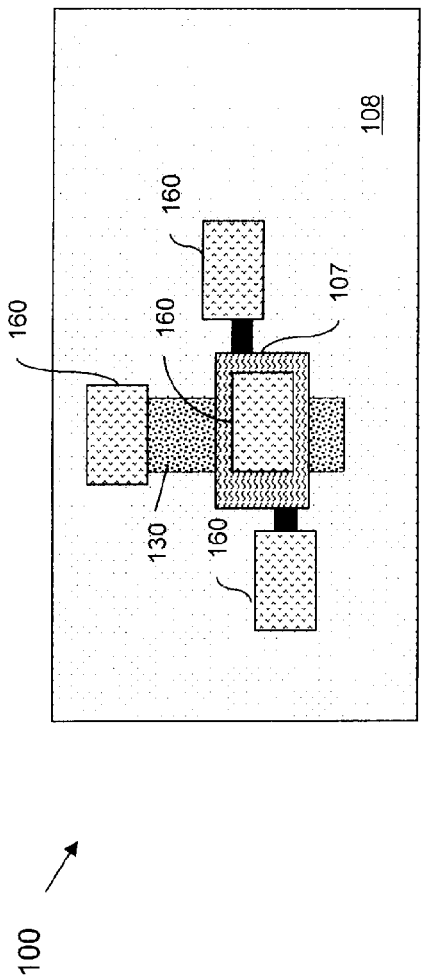
FIG. 6 is a schematic diagram illustrating a top view of FIG. 5.

Furthermore, as illustrated in FIGS. 5 and 6, instead of or in addition to using a conductive layer 104 below the isolation layer 106 as a back gate, a dielectric layer 108 can surround the semiconductor body 120 and gate 130 and a conductive pad 107 can be positioned above the portion of the gate 130 around which the semiconductor body 120 is wrapped. This conductive pad can similarly be biased to form virtual source/drain regions. Those skilled in the art will recognize that the conductive pad 107 that is incorporated into the structure 100 and illustrated in FIGS. 5 and 6 may similarly be incorporated into the structure 200.

Figure 7:
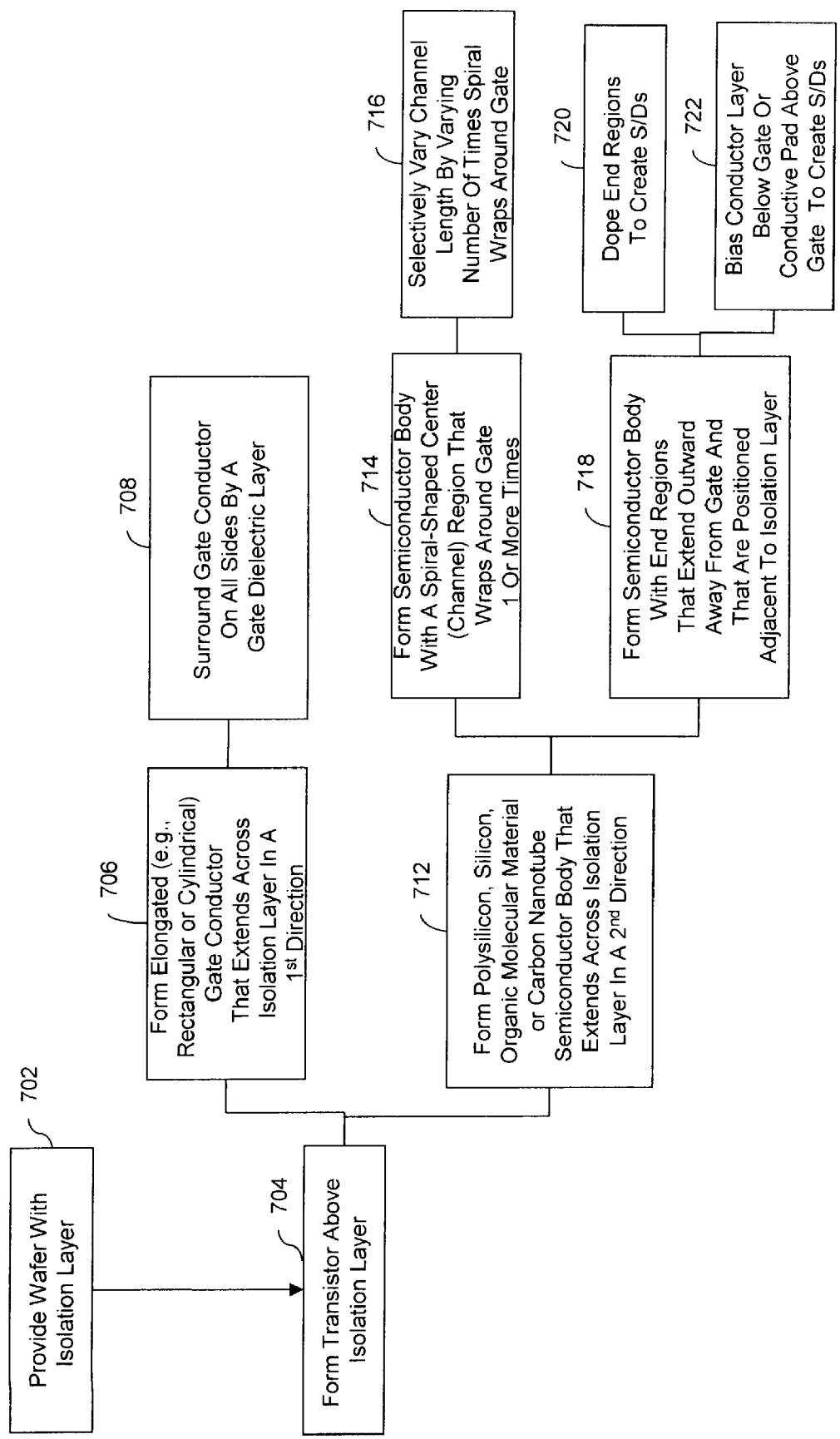
FIG. 7 is a schematic flow diagram illustrating an embodiment of a method of forming the transistor embodiments of the invention, generally.

FIG. 7 provides a flow diagram illustrating embodiments of a method of forming the transistor embodiments 100 and 200, described above. Referring to FIG. 7 in combination with FIGS. 1-4, the embodiments of the method comprise providing a wafer comprising a multi-layer substrate 101, 201. The substrate 101, 201 can comprise a thin isolation layer 106, 206 (e.g., a thin oxide layer or another dielectric layer) on at least one additional layer 104, 204. The at least one additional layer 104, 204 can comprise, for example, either a conductor layer (e.g., a doped semiconductor layer, such as a doped silicon or polysilicon layer, or a metal layer) or a semiconductor layer (702).

Then, the transistor 100, 200, including a gate 130, 230 and a semiconductor body 120, 220 is formed by conventional processing techniques on the wafer 101 above the isolation layer 106, 206 (704)

To form the gate 130, 230 an elongated gate conductor 132, 232 (e.g., a cylindrical or rectangular conductor body) is formed that extends across the isolation layer 106, 206 in a first direction 191, 292 and is surrounded on all sides by a gate dielectric layer 135, 235 (706-708). The gate conductor 132, 232 can, for example, be formed from a highly doped semiconductor material, such as a doped polysilicon. For carbon nanotubes, the gate conductor can also be a metal, e.g., W, Pd, Al, Ti etc.

To form the semiconductor body 120, 220, an elongated semiconductor structure (e.g., a polysilicon semiconductor body, a silicon semiconductor body, a carbon nanotube semiconductor body, a semiconductor body comprising an organic molecular material, a semiconductor body comprising another suitable semiconductor material, etc.) is formed that extends across the isolation layer 106, 206 in a second direction 192, 292 that is different from the first direction 191, 191 (712). This second direction 192, 292 can, for example, be approximately opposite the second direction 191, 291.

Specifically, the semiconductor body 120, 220 is formed with a spiral-shaped center region 123, 223 that wraps around the gate 130, 230 one or more times and comprises the channel region of the transistor 100, 200 (714). The semiconductor body 120, 220 is further formed so that it has end regions 121-122, 221-222 that extend outward away from the gate 130, 230 and, specifically, away from the ends 126a, 226a and 126b, 226b of the center region 123, 223 in opposite directions and adjacent to the isolation layer 106, 206 (718).

The embodiments of the method can also comprise selectively adjusting the effective channel length ($L_{eff}$) of the channel region 123, 223 by varying the number of times the center region 123, 223 is wrapped around the gate 130 during the semiconductor body formation process 714 (720). The more times it wraps around the gate 130, the greater the effective channel length ($L_{eff}$).

The embodiments of the method can further comprise creating source/drain regions in the end regions 121-122, 221-222 of the semiconductor body 120, 220 by using conventional processing techniques to dope the end regions 121-122, 221-222 with either a p-type dopant (e.g., boron (B)) or an n-type dopant (e.g., phosphorous (P), arsenic (As) or antimony (Sb), one electron oxidants) and, thereby, configuring the FET 100, 200 as either a p-type FET or an n-type FET, respectively (720), for the cases where the semiconductor body 120 comprises silicon or polysilicon. Alternatively, the embodiments of the method can comprise creating the source/drain regions in the end regions 121-122, 221-222 of the semiconductor body 120, 220 by leaving the end regions 121-122, 221-222 undoped and by selectively biasing a conductor layer 104 formed below the isolation layer 106, i.e., a back gate or by biasing a conductive pad 107 formed above the portion of the gate 130 around which the semiconductor body 120 is wrapped (e.g., as illustrated in FIGS. 5 and 6). Such biasing can be used to impart a preselected Fermi potential to the end regions 121-122, 221-222 (722). For example, if the Fermi level of the end regions 121-122, 221-222 of a semiconductor body 120, 220 is forced to either the valence or conduction bands, then what are generally referred to in the art as "virtual" source/drain regions are created, thereby, configuring the FET 100, 200 as either a p-type FET or an n-type FET. The decision to create the source/drain regions by doping or by biasing will depend upon the materials and/or the processes steps used to form the semiconductor body 120, 220. For example, those skilled in the art will recognize that carbon nanotubes are not easily doped. Therefore, if the transistor 100 or 200 is to be formed with a carbon nanotube semiconductor body, then it would be preferable to form "virtual" source/drain regions.

Figure 8:
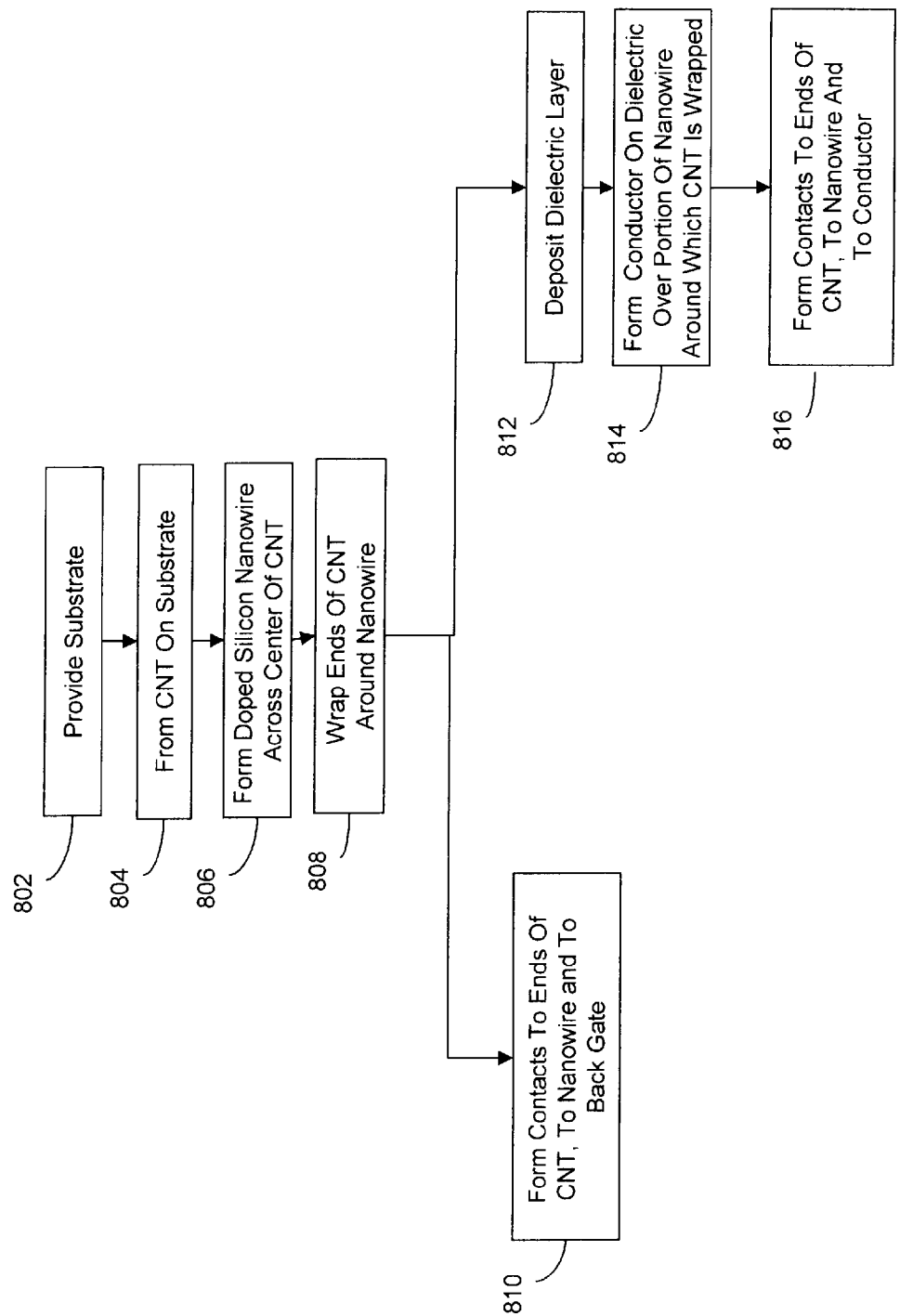
FIG. 8 is a schematic flow diagram illustrating an embodiment of a method of forming the transistor embodiment 100, specifically.

More particularly, referring to FIG. 8, a transistor embodiment 100 of FIG. 1 with a carbon nanotube semiconductor body 120 can be formed, for example, by providing a multi-layer substrate (802). For example, a substrate 101a can be provided that comprises an isolation layer 106a (e.g., an oxide layer or other dielectric layer) on a conductor layer 104a (e.g., a doped semiconductor layer, such as a doped silicon or polysilicon layer, or a metal layer) (see FIG. 9a). Alternatively, a substrate 101b can be provided that comprises isolation layer 106b (e.g., a quartz layer or an oxide layer) on a semiconductor layer 104b (e.g., on a silicon layer) (see FIG. 9b). Then, a carbon nanotube 120 can be formed (e.g., deposited) on the substrate 101a, 101b (804, see FIGS. 9a and 9b).

This carbon nanotube 120 can be formed using conventional carbon nanotube processing techniques, for example, arc evaporation, or passing of carbon-containing gases over nanoparticles of Co, Fe, or Ni, which act as catalysts for formation of carbon nanotubes.

Figure 11A:
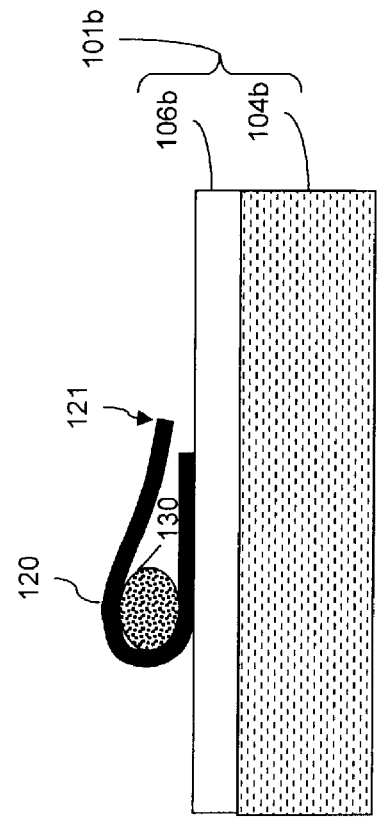
FIG. 11a is a schematic diagram illustrating a partially completed transistor 100 formed on a substrate 101a according to the method embodiment of FIG. 8.
Figure 11B:
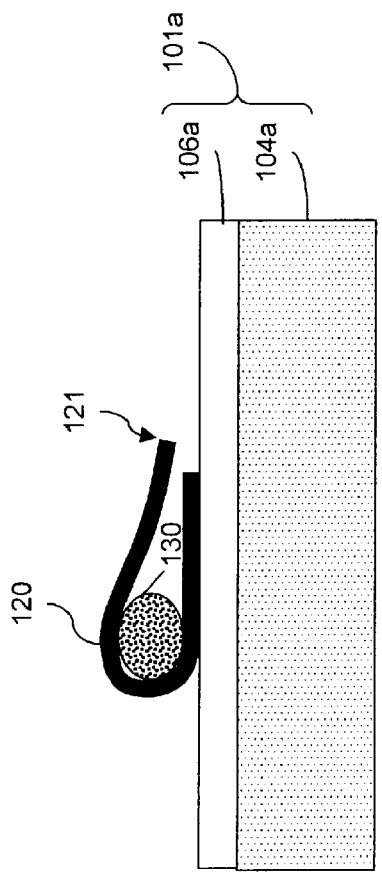
FIG. 11b is a schematic diagram illustrating a partially completed transistor 100 formed on a substrate 101b according to the method embodiment of FIG. 8.
Figure 12:
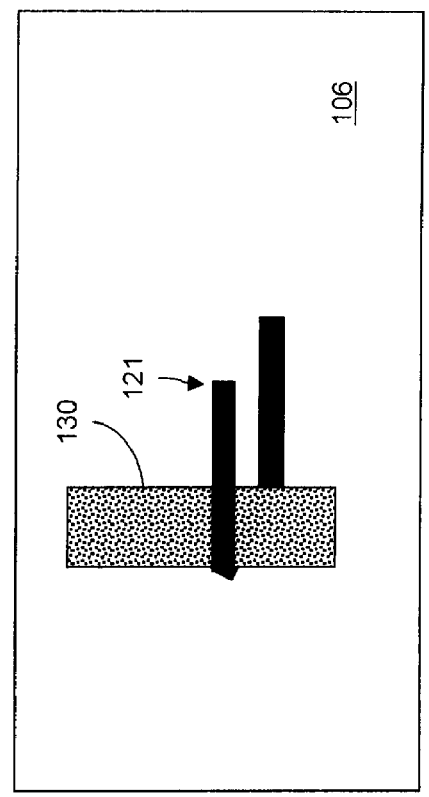
FIG. 12 is a top view of the partially completed structures of both FIGS. 11a and 11b.

Next, a doped silicon nanowire 130 can deposited on the substrate (806, see FIGS. 10a and 10b). A atomic force microscope (AFM), or a scanning-electron microscope (SEM) can be employed to identify the carbon nanotube 120 upon which a silicon nanowire 130 has been deposited. Then, the ends 121, 122 of the CNT 120 are wrapped around the nanowire 130 (808). That is, the AFM can be used to first lift one exposed end 121 of the carbon nanotube 120 above and over the silicon nanowire 130 (see FIGS. 11a, 11b and 12). Similarly, the AFM is used to lift the second exposed end 122 of the carbon nanotube 120 above and over the silicon nanowire 130 in the opposite direction of the first end 121 (see FIGS. 13a, 13b, and 14).

Figure 15:
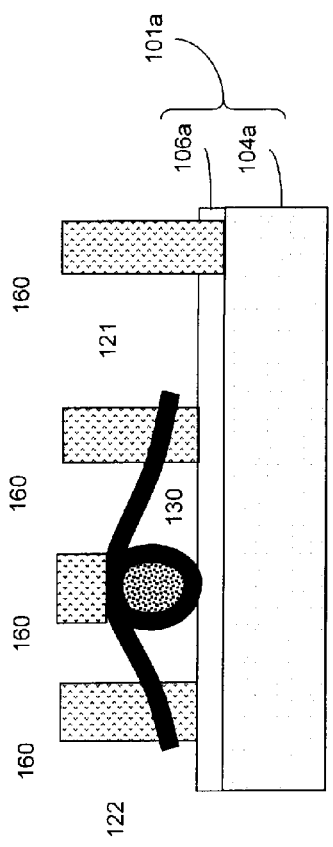
FIG. 15 is a schematic diagram illustrating a partially completed transistor 100 formed on a substrate 101a according to the method embodiment of FIG. 8.
Figure 16:
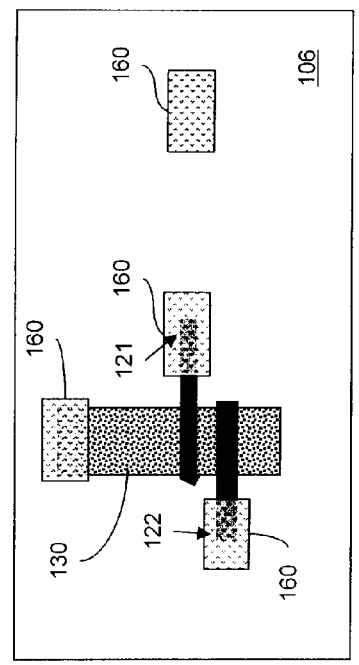
FIG. 16 is a top view of the partially completed structure of FIG. 15.

If a substrate 101a with a conductor layer 104a below an insulator layer 106a is provided at process 802, then contacts 160 (e.g., platinum contacts) are patterned and formed on the two ends 121, 122 of the carbon nanotube to form source and drain contacts, on the silicon nanowire 130 to form a gate contact, and on the conductor layer 104a to form the back gate contact (810, see FIGS. 15 and 16). The contact to the conductor layer 104 allows the application of an electrical bias to induce the virtual source/drain regions in the ends 121-122 of the carbon nanotube 120, as discussed above.

Figure 17:
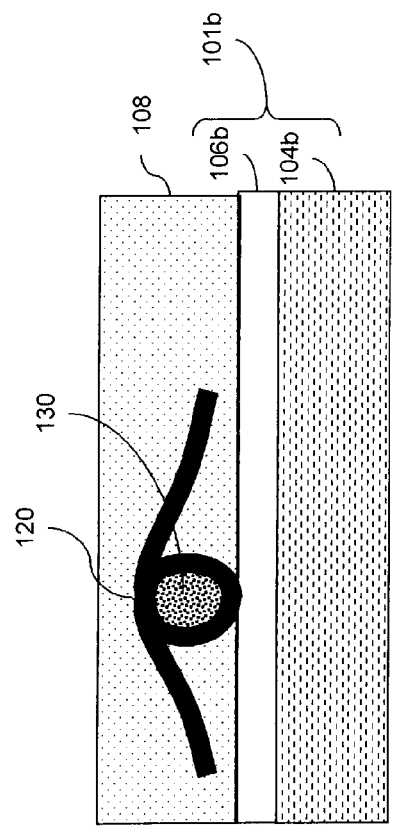
FIG. 17 is a schematic diagram illustrating a partially completed transistor 100 formed on a substrate 101b according to the method embodiment of FIG. 8.
Figure 18:
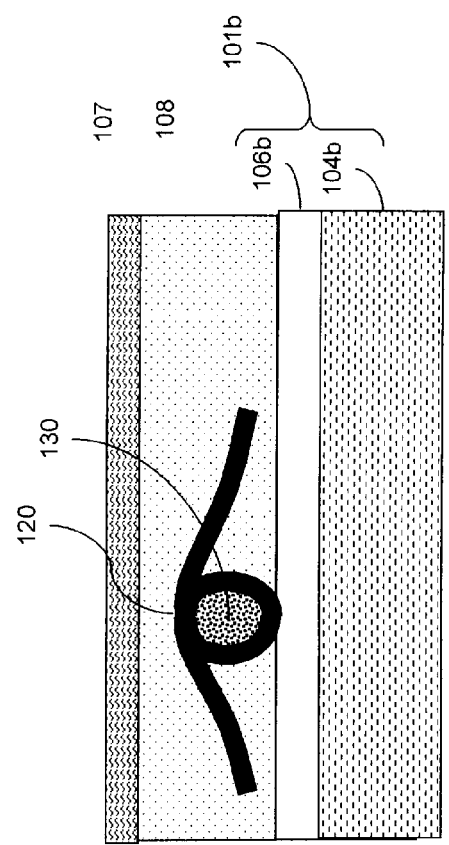
FIG. 18 is a schematic diagram illustrating a partially completed transistor 100 formed on a substrate 101b according to the method embodiment of FIG. 8.
Figure 19:
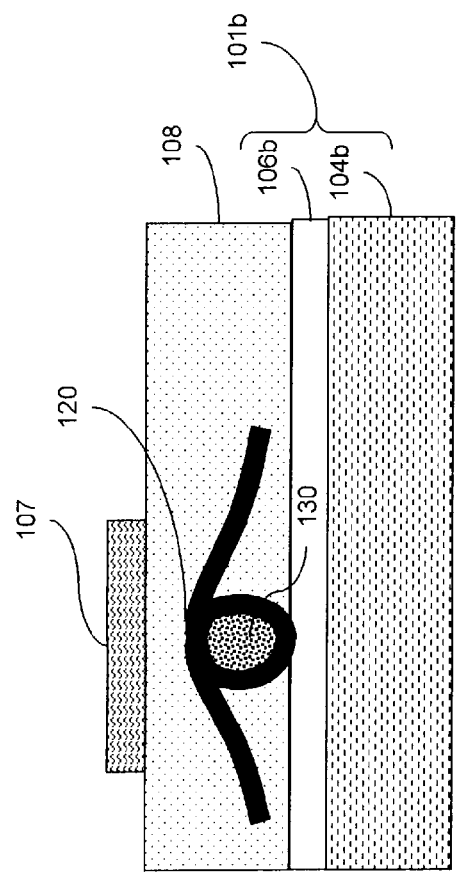
FIG. 19 is a schematic diagram illustrating a partially completed transistor 100 formed on a substrate 101b according to the method embodiment of FIG. 8.
Figure 20:
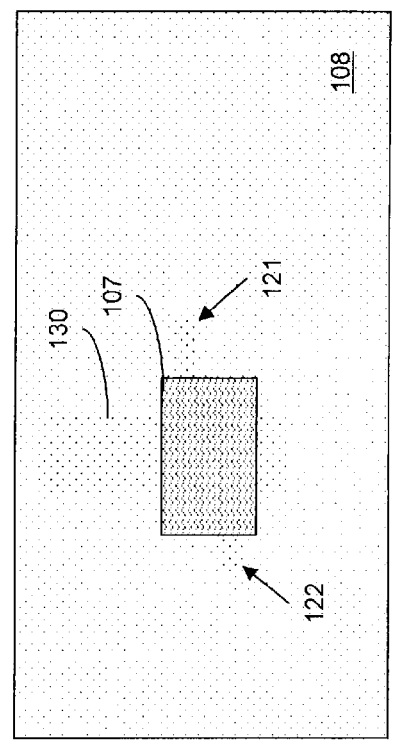
FIG. 20 is a schematic diagram illustrating a partially completed transistor 100 formed on a substrate 101b according to the method embodiment of FIG. 8.

Alternatively, if the substrate 101b without a back gate structure (e.g., with a semiconductor layer 104b vice a conductor layer 104a) is provided at process 802, then a dielectric is deposited over the entire structure, for example, by means such as low-temperature chemical vapor deposition (812, see FIG. 17). Then, a conductive material, such as a doped polysilicon is deposited (see FIG. 18) and patterned over the portion of the silicon nanowire 130 around which the carbon nanotube 120 is wrapped in order to form a conductive pad 107 (814, see FIGS. 19-20). After the conductive pad 107 is formed, contacts 160 (e.g. of platinum contacts) are formed to the exposed ends 121, 122 of the carbon nanotube to form source/drain contacts, to the silicon nanowire 130 to form the gate contact and to the conductive pad (816). Thus, contact to the conductive pad 107 allows the application of an electrical bias to induce the virtual source/drain regions in the ends 121-122 of the carbon nanotube 120, as discussed above.

Figure 21:
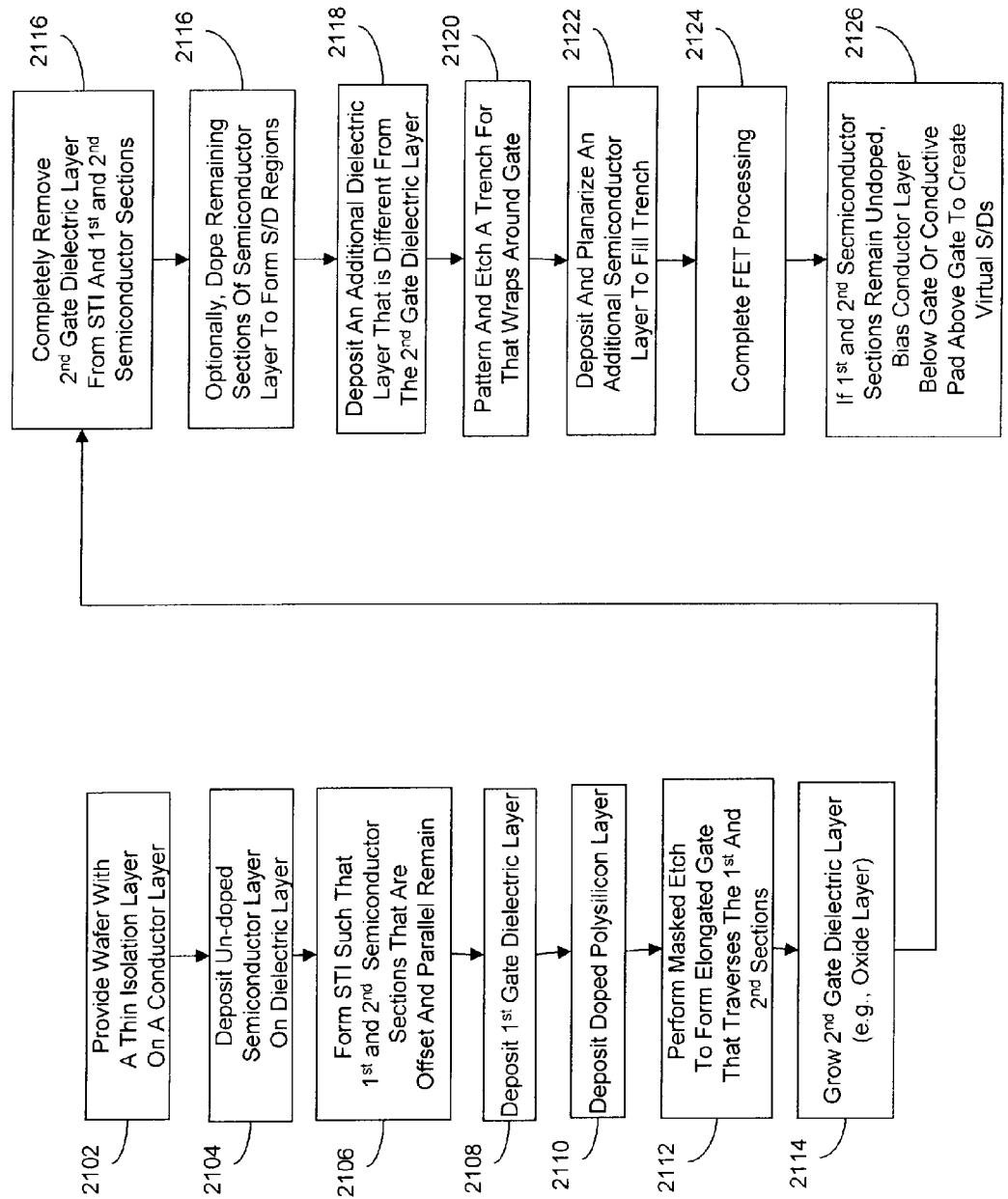
FIG. 21 is a schematic flow diagram illustrating an embodiment of a method of forming the transistor embodiment 200, specifically.
Figure 22:
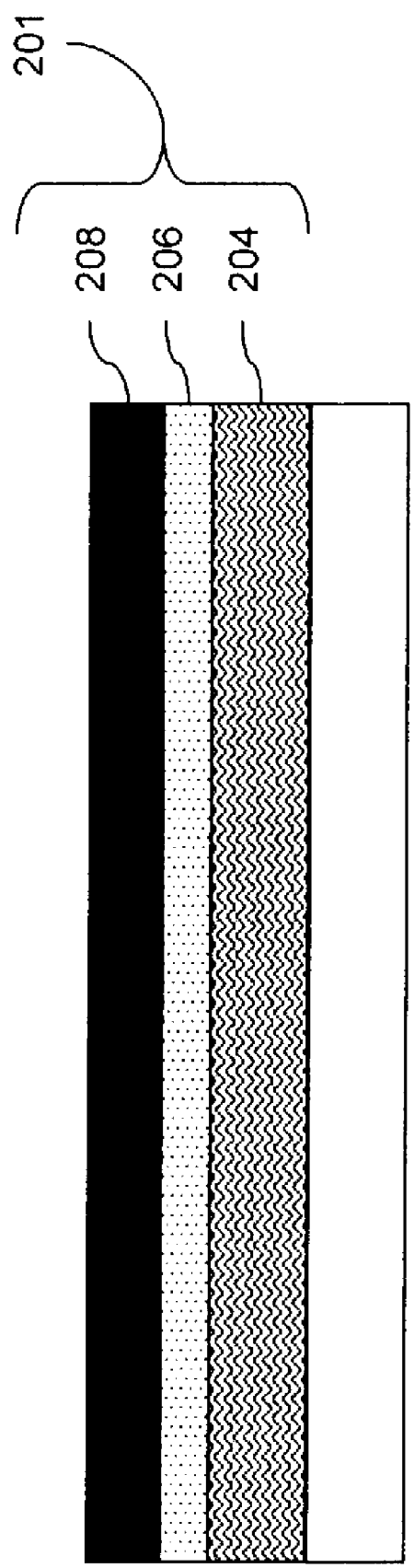
FIG. 22 is a schematic diagram illustrating a partially completed transistor 200.

Alternatively, referring to FIG. 21, the transistor embodiment 200 of FIGS. 2-4 with a polysilicon or silicon semiconductor body 220 can be formed, for example, by first providing a wafer comprising a multi-layer substrate 201 (2102, see FIG. 22). For example, the substrate 201 can comprise an isolation layer 206 (e.g., an oxide layer or other dielectric layer) on at least one additional layer 204. This additional layer 204 can comprise a conductor layer (e.g., a doped semiconductor layer, such as a doped silicon or polysilicon layer, or a metal layer) immediately below the isolation layer. Alternatively, this additional layer 204 can comprise semiconductor layer (e.g., on a silicon layer) below the isolation layer 106. Then, an undoped (i.e., intrinsic) semiconductor layer 208 (e.g., an undoped polysilicon layer or an undoped silicon layer) is formed (e.g., deposited) onto the isolation layer 206 (2104).

Figure 23:
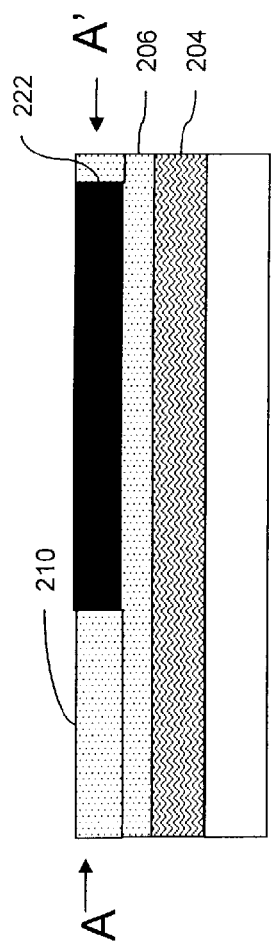
FIG. 23 is a schematic diagram illustrating a partially completed transistor 200.
Figure 24:
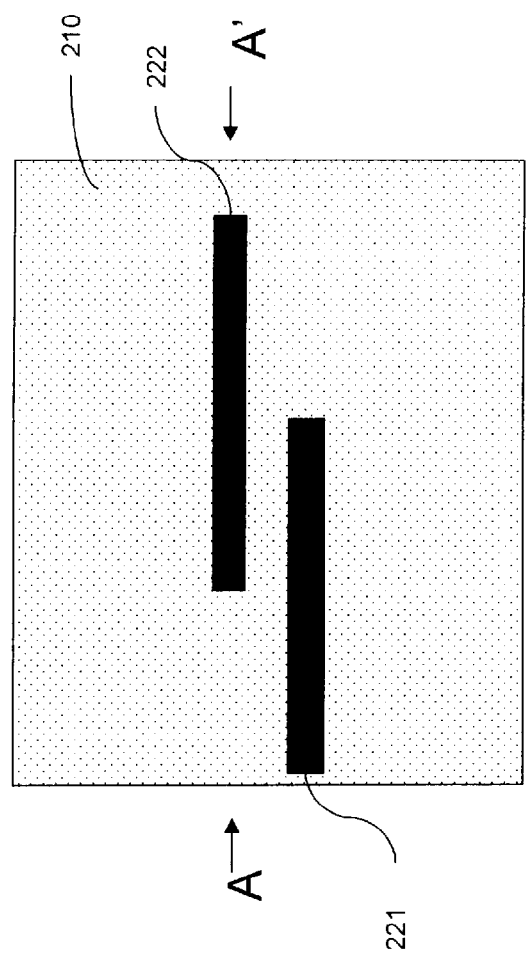
FIG. 24 is a schematic diagram illustrating a top view of the partially completed transistor of FIG. 23.

After the semiconductor layer 208 is formed at process 2104, shallow trench isolation (STI) structures 210 are formed in the semiconductor layer 208 such that what remains of semiconductor layer 208 are first and second semiconductor sections 221 and 222 that are partially offset, parallel to each other and isolated from each other by the STI structures 210 (2106, see FIGS. 23 and 24). Specifically, a photoresist layer is deposited and lithographically patterned to form a mask over sections 221 and 222 of the semiconductor layer 208. The semiconductor layer 208 is then etched, using a directional etch process, to create trenches in the semiconductor layer 208. The photoresist layer is removed and an a isolation material (e.g., an oxide) is deposited and planarized, thereby filling in the trenches 210 and isolating the remaining sections 221-222 of the semiconductor layer 208.

Figure 25:
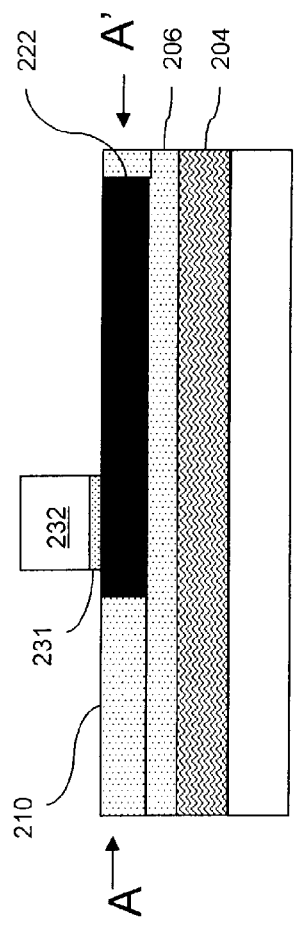
FIG. 25 is a schematic diagram illustrating a partially completed transistor 200.
Figure 26:
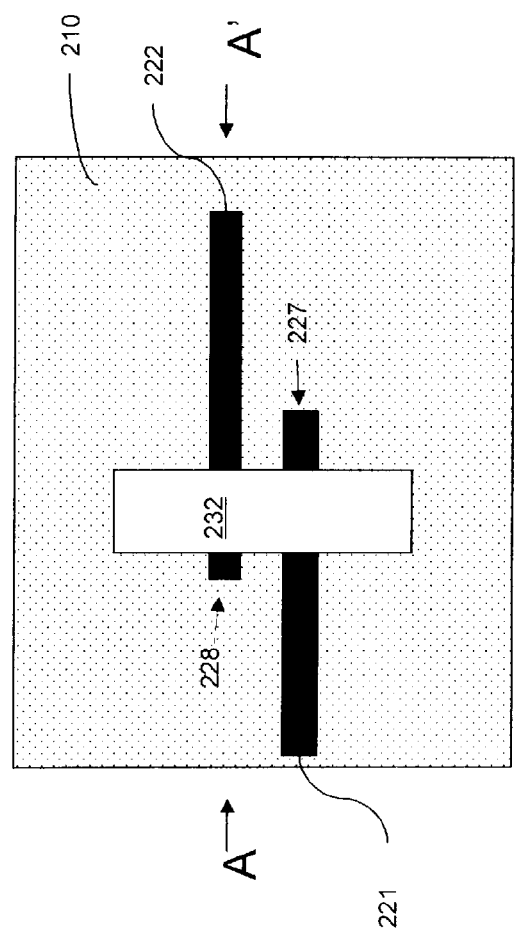
FIG. 26 is a schematic diagram illustrating a top view of the partially completed transistor of FIG. 25.

Following STI 210 formation at process 2106, a first gate dielectric layer 231 (e.g., a thin silicon dioxide film or other thin dielectric layer) is formed (e.g., deposited) above the STI 210 and the semiconductor sections 221-222 (2108). This process 2108 is followed by deposition of a gate conductor layer 232 (e.g., a highly doped semiconductor layer, such as a highly doped polysilicon layer, or a metal) on top of the first gate dielectric layer (2110). Then, using a masked etch process the gate conductor layer 232 and first gate dielectric layer 231 are patterned and etched to form an elongated body that traverses the first and second semiconductor sections 221-222 at opposite ends 227 and 228, respectively (2112, see FIGS. 25 and 26).

Figure 27:
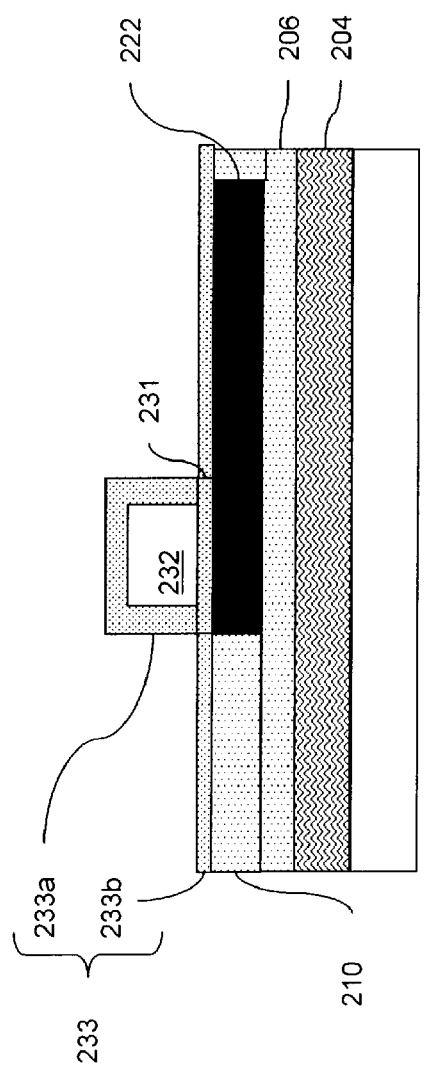
FIG. 27 is a schematic diagram illustrating a partially completed transistor 200.

Then, a second gate dielectric layer 233 can be formed on the wafer and, specifically, on the STI 210, on semiconductor sections 221-222 and on the top surface and sidewalls of the gate conductor 232 (2114, see FIG. 27). Formation of the second gate dielectric layer 233 can be accomplished, for example, using conventional processing techniques to grow a silicon dioxide layer. Those skilled in the art will recognize that if the gate conductor material comprises a highly doped semiconductor, an oxide will grow faster on the gate conductor 232 than elsewhere on the wafer. Thus, as illustrated in FIG. 27, the second gate dielectric layer 233 can be formed with a first thicker portion 233a over the gate conductor 232 and a second thinner portion 233b over the STI 210 and undoped semiconductor sections 221-222.

Figure 28:
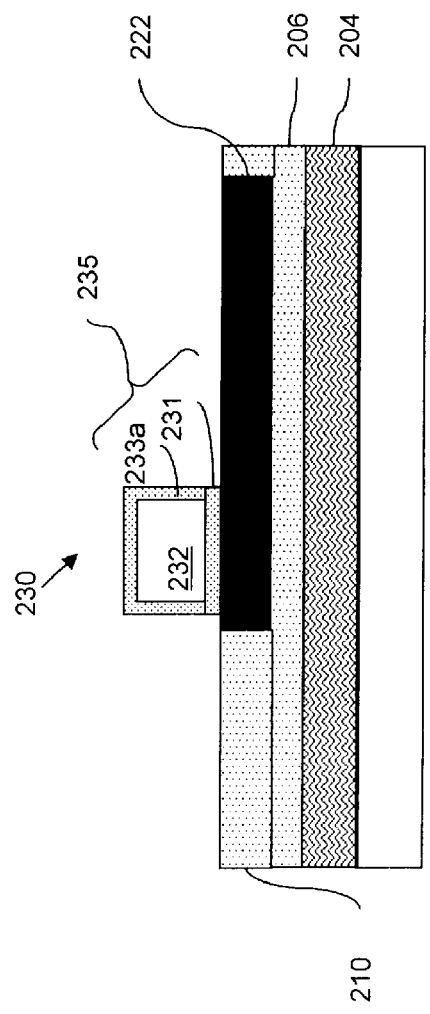
FIG. 28 is a schematic diagram illustrating a partially completed transistor 200.

After the second gate dielectric layer 233 is formed at process 2114, an etch process can be performed to selectively remove the portion 233b of second gate dielectric layer from above the STI 210 and semiconductor sections 221-222, leaving the top surface and sidewalls of the gate conductor 232 covered (2116, see FIG. 28). Since portion 233b is thinner than portion 233a, an isotropic etch process can be used to completely remove portion 233b while only partially etching portion 233a. The $1^{st}$ gate dielectric layer 231 below the gate conductor and the portion 233a of the second gate dielectric layer 233 on the sidewalls and top surface of the gate conductor 230 combine to form the complete gate dielectric layer 235 that surrounds the gate conductor 232 on all sides, thereby completing the gate 230 structure. Those skilled in the art will recognize that given the different processing steps used to form the first gate dielectric layer 231 and portion 233a of the second gate dielectric layer 233, they may have different thicknesses and/or they may comprise different dielectric materials.

Optionally, following formation of the gate 230, the sections 221-222 may be appropriately doped (e.g., using a masked implantation process) with a p-type dopant (e.g., boron (B)) or an n-type dopant (e.g., phosphorous (P), arsenic (As) or antimony (Sb)), in order to form the source/drain regions and configure the FET as either a p-type or n-type FET, respectively (2116). Alternatively, the sections 221-222 may be left undoped and "virtual" source/drain regions can be created following completion of the FET structure (see process 2126 below).

Figure 29:
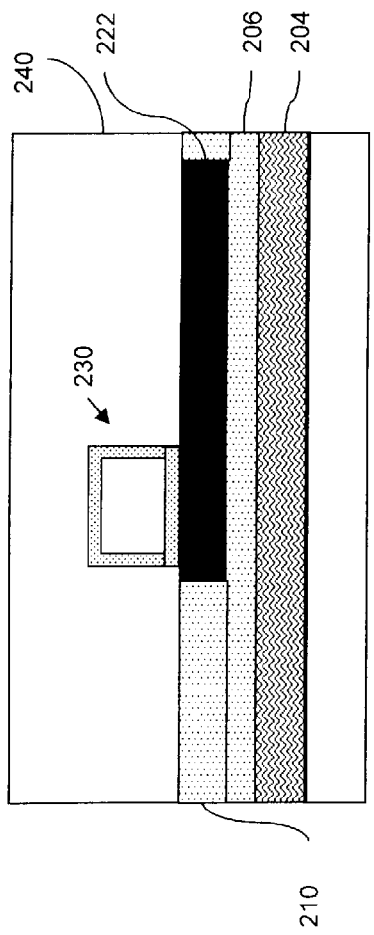
FIG. 29 is a schematic diagram illustrating a partially completed transistor 200.
Figure 30:
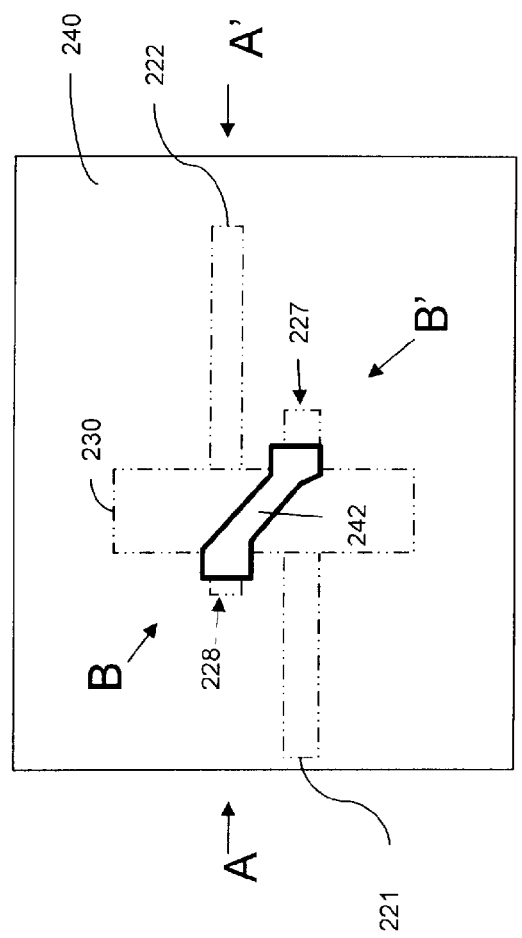
FIG. 30 is a schematic diagram illustrating a top view of the partially completed transistor 200.
Figure 31:
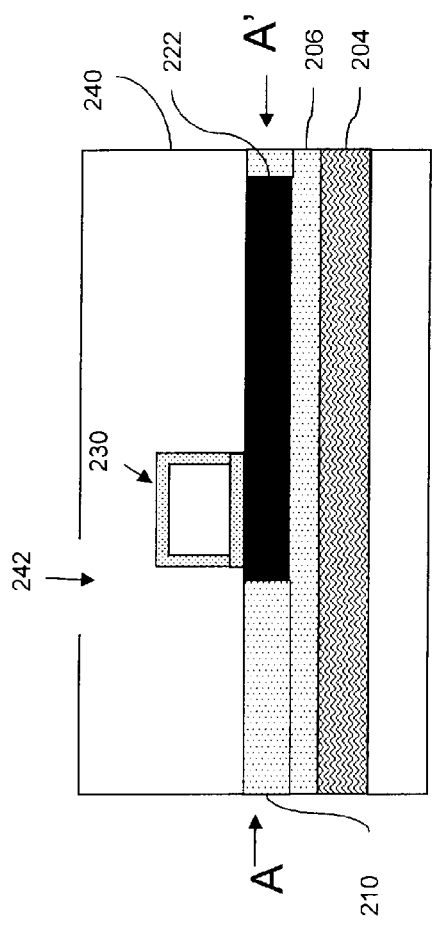
FIG. 31 is a schematic diagram illustrating a cross-section (A-A') view of the partially completed transistor of FIG. 30.
Figure 32:
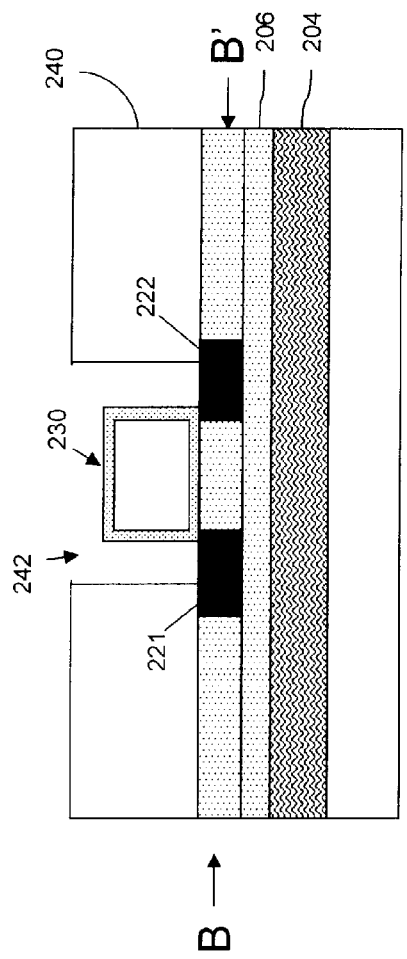
FIG. 32 is a schematic diagram illustrating another cross-section (B-B') view of the partially completed transistor of FIG. 30.

Next, deposit and planarize an additional dielectric material 240 (e.g., a nitride layer) that is different from the $2^{nd}$ gate dielectric material such that it can be selectively etched (2118, see FIG. 29). Then, a trench 242 can be lithographically patterned such that it extends diagonally across the gate 230 between one end 227 of the first semiconductor section 221 and an opposite end 228 of the second semiconductor sections 222. The trench 242 can then be selectively etched into the nitride layer 240 to expose a portion of the gate that wraps around the gate sidewalls and top surface and also to expose the ends 227 and 228 of the semiconductor sections 221 and 222, respectively (2120, see FIGS. 30-32).

To complete the semiconductor body 220 of FIGS. 2-4, an additional undoped semiconductor layer comprising the same material as the semiconductor layer 208 can be deposited and planarized, thereby filling the trench 242 and forming the center region 223 of the semiconductor body 220 that is wraps around the gate 230 at least one time and contacts semiconductor sections 221-222 (i.e., end regions) that extend outward away from the gate 230 in opposite directions (2122, see FIGS. 2-4).

Following formation of the center region 223, additional FET processing can be performed to complete the FET structure 200 (2124). For example, referring to FIG. 2, contacts 260 (e.g., platinum contacts) can be formed through the nitride layer using conventional processing techniques.

As with the previously described method embodiment for forming the structure 100 of FIG. 1, in this embodiment, if at process 2102 a substrate 201 is provided with a conductor layer below the insulator layer, then contacts 260 can be patterned and formed on the two ends 221, 222 to form source and drain contacts, on the gate 130 to form a gate contact, and on the conductor layer 204 to form the back gate contact. The contact to the conductor layer 204 allows the application of an electrical bias to induce the virtual source/drain regions in the ends 221-222 of the carbon nanotube 120, as discussed above (2126)

Alternatively, if at process 2102 a substrate 201 is provided without a back gate structure, then additional processing can include forming a conductive pad over the portion of the gate 130 around which the semiconductor 220 is wrapped. After the conductive pad is formed, contacts (e.g. of platinum contacts) can be formed to the ends 221, 222 to form source/drain contacts, to the gate 230 to form the gate contact and to the conductive pad. The contact to the conductive pad allows the application of an electrical bias to induce the virtual source/drain regions in the ends 221-222 of the semiconductor 120, as discussed above (2126). For example, if the Fermi level of the end regions 221-222 of a semiconductor body 220 is forced to either the valence or conduction bands, then what are generally referred to in the art as "virtual" source/drain regions are created, thereby configuring the FET 200 as either a p-type FET or an n-type FET, respectively.

Therefore, disclosed above are embodiments of a field effect transistor and a method of forming the transistor that incorporates a semiconductor body with a spiral-shaped center channel region wrapped one or more times around a gate and with end regions that extend outward from the center region in opposite directions away from the gate. Source/ drain regions are formed in the end regions by either doping the end regions or by biasing a conductor above or below the gate to impart a preselected Fermi potential on the end regions. This disclosed structure allows the transistor size to be scaled without decreasing the effective channel length ($L_{eff}$) to the point where deleterious short-channel effects are exhibited. It further allows the transistor size to be scaled while also allowing the effective channel length ($L_{eff}$) to be selectively increased (e.g., by increasing the number of times the channel wraps around the gate).

The inventive transistor enables channel lengths that are longer than the physical space used by the transistor, which delivers superior short-channel effects and reduced leakage power. As a result low power operation at high speed is enabled, as well as reduced manufacturing costs due to improved circuit density.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A transistor comprising:
a gate; and
an elongated semiconductor body comprising a center region and end regions, wherein said center region comprises a channel region that spirals around said gate at least one time and wherein said end regions comprise source/drain regions that extend outward away from said gate.

2. The transistor of claim 1, wherein an effective channel length of said channel region is dependent upon the number of times said center region spirals around said gate.

3. The transistor of claim 1, further comprising an isolation layer below said gate and said semiconductor body and a conductor layer below said isolation layer, wherein said conductor layer is biased so as to create said source/drain regions in said end regions and wherein said end regions are adjacent to said isolation layer.

4. The transistor of claim 1, further comprising a conductive pad above a portion of said gate around which said semiconductor body spirals, wherein said conductive pad is biased so as to create said source/drain regions in said end regions.

5. The transistor of claim 1, wherein said end regions are doped so as to create said source/drain regions.

6. The transistor of claim 1, wherein said semiconductor body comprises one of polysilicon, silicon, an organic molecular material, and a carbon nanotube.

7. A transistor comprising:
a gate; and
an elongated carbon nanotube comprising a center region and end regions, wherein said center region comprises a channel region that spirals around said gate at least one time and wherein said end regions comprise source/drain regions that extend outward away from said gate.

8. The transistor of claim 7, wherein an effective channel length of said channel region is dependent upon the number of times said center region spirals around said gate.

9. The transistor of claim 7, further comprising an isolation layer below said gate and said carbon nanotube and a conductor layer below said isolation layer, wherein said conductor layer is biased so as to create said source/drain regions in said end regions.

10. The transistor of claim 7, further comprising a conductive pad adjacent to a portion of said gate around which said carbon nanotube spirals, wherein said conductive pad is biased so as to create said source/drain regions in said end regions.

11. A transistor comprising:
a gate; and
an elongated polysilicon body comprising a center region and end regions, wherein said center region comprises a channel region that spirals around said gate at least one time and wherein said end regions comprise source/drain regions that extend outward away from said gate.

12. The transistor of claim 11, wherein an effective channel length of said channel region is dependent upon the number of times said center region spirals around said gate.

13. The transistor of claim 11, further comprising an isolation layer below said gate and said polysilicon body and a conductor layer below said isolation layer, wherein said conductor layer is biased so as to create said source/drain regions in said end regions.

14. The transistor of claim 11, further comprising a conductive pad adjacent to a portion of said gate around which said polysilicon body spirals, wherein said conductive pad is biased so as to create said source/drain regions in said end regions.

15. The transistor of claim 11, wherein said end regions are doped so as to create said source/drain regions.

16. A method of forming a transistor comprising:
providing a wafer;
forming on said wafer an elongated semiconductor body and a gate, wherein said semiconductor body is formed such that a center portion of said semiconductor body comprises a channel region that spirals around said gate at least one time and such that end regions of said semiconductor body comprise source/drain regions that extend outward away from said gate.

17. The method of claim 16, further comprising selectively adjusting the effective channel length of said channel region by varying the number of times said center region spirals around said gate.

18. The method of claim 16, wherein said providing of said wafer comprises providing a wafer with a conductor layer and an isolation layer on said conductor layer and wherein said method further comprises biasing said conductor layer so as to create said source/drain regions in said end regions.

19. The method of claim 16, further comprising doping said end regions so as to create said source/drain regions.

20. The method of claim 16, further comprising forming a conductive pad above a portion of said gate around which said semiconductor body spirals; and biasing said conductive pad so as to create said source/drain regions in said end regions.

21. The method of claim 16, wherein said forming of said semiconductor body comprises forming one of a polysilicon body, silicon body, a body comprising an organic molecular material, and a carbon nanotube body.

* * * * *